US012608516B2

(12) United States Patent
Chang et al.

(10) Patent No.: US 12,608,516 B2
(45) Date of Patent: Apr. 21, 2026

(54) INJECTION MOLDING METHOD AND SYSTEM

(71) Applicant: CORETECH SYSTEM CO., LTD., Zhubei City (TW)

(72) Inventors: Rong-Yeu Chang, Zhubei City (TW); Chia-Hsiang Hsu, Zhubei City (TW); Yi-Hui Peng, Zhubei City (TW); Chih-Chung Hsu, Zhubei City (TW); Chuan-Wei Chang, Zhubei City (TW); Po-Yang Yeh, Zhubei City (TW)

(73) Assignee: CORETECH SYSTEM CO., LTD., Zhubei City (TW)

( * ) Notice: Subject to any disclaimer, the term of this patent is extended or adjusted under 35 U.S.C. 154(b) by 1025 days.

(21) Appl. No.: 17/735,008

(22) Filed: May 2, 2022

(65) Prior Publication Data
US 2022/0366102 A1      Nov. 17, 2022

Related U.S. Application Data

(60) Provisional application No. 63/187,545, filed on May 12, 2021.

(51) Int. Cl.
*G06F 30/20*       (2020.01)
*B29C 45/76*       (2006.01)

(52) U.S. Cl.
CPC ............. *G06F 30/20* (2020.01); *B29C 45/76* (2013.01)

(58) Field of Classification Search
CPC ..... G06F 30/20; G06F 2113/22; B29C 45/76; B29C 45/766; B29C 2945/76929
See application file for complete search history.

(56) References Cited

U.S. PATENT DOCUMENTS

2017/0286572 A1      10/2017   Hershey et al.

OTHER PUBLICATIONS

Liau, Y., H. Lee, and K. Ryu. "Digital Twin concept for smart injection molding." IOP Conference Series: Materials Science and Engineering. vol. 324. IOP Publishing, 2018. (Year: 2018).*
(Continued)

*Primary Examiner* — Saif A Alhija
(74) *Attorney, Agent, or Firm* — MUNCY, GEISSLER, OLDS & LOWE, P.C.

(57) ABSTRACT
The present disclosure provides an injection molding method and system. The injection molding method includes the operations of: sensing physical parameters associated with an injection molding product; analyzing physical parameters to generate an optimized digital twin model of a physical asset; and producing the injection molding product according to the optimized digital twin model. Analyzing the physical parameters to generate the optimized digital twin model of the physical asset includes operations of: simulating, by a digital twin model, the physical parameters to generate simulated parameters according to first input parameters; validating whether the digital twin model is an optimized digital twin model according to the simulated parameters and the physical parameters; and optimizing the digital twin model to generate the optimized digital twin model when the physical parameters differ from the simulated parameters.

15 Claims, 6 Drawing Sheets

(56) References Cited

OTHER PUBLICATIONS

Hürkamp, André, et al. "Combining simulation and machine learning as digital twin for the manufacturing of overmolded thermoplastic composites." Journal of Manufacturing and Materials Processing 4.3 (2020): 92. (Year: 2020).*

Lacueva-Pérez, Francisco José, et al. "SHION (smart thermoplastic injection): An interactive digital twin supporting real-time shopfloor operations." IEEE Internet Computing 26.3 (2020): 23-32. (Year: 2020).*

Lee, Hwaseop, Kwangyeol Ryu, and Youngju Cho. "A framework of a smart injection molding system based on real-time data." Procedia Manufacturing 11 (2017): 1004-1011. (Year: 2017).*

* cited by examiner

S422

S4221 — Comparing the plurality of simulated parameters to the physical parameters.

FIG. 6

INJECTION MOLDING METHOD AND SYSTEM

CROSS-REFERENCE TO RELATED APPLICATIONS

This application claims the benefit of prior-filed provisional application with application No. 63/187,545, filed May 12, 2021, which is incorporated by reference in its entirety.

TECHNICAL FIELD

The present disclosure relates to an injection molding method and system, and more particularly, to an injection molding method and system of performing digital twin simulation.

DISCUSSION OF THE BACKGROUND

The requirements of the injection molding process vary with different proposes of products. The injection machineries are also various to each other. Before actually manufacturing the products, the simulation for the final products becomes an important step to predict whether the products satisfy the requirement. As mentioned above, because the injection machineries and requirements are different from cases, the precision of the simulation becomes more challenged.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an injection molding method including the operations of: sensing, by a sensing device, a plurality of physical parameters associated with an injection molding product; analyzing, by a process device, the plurality of physical parameters to generate an optimized digital twin model of a physical asset; producing, by the physical asset, the injection molding product according to the optimized digital twin model. The operation of analyzing the plurality of physical parameters to generate the optimized digital twin model of the physical asset includes the operations of: simulating, by a digital twin model, the plurality of physical parameters to generate a plurality of simulated parameters according to a plurality of first input parameters; validating whether the digital twin model is an optimized digital twin model according to the plurality of simulated parameters and the plurality of physical parameters; and optimizing, by the process device, the digital twin model to generate the optimized digital twin model when the plurality of physical parameters differ from the plurality of simulated parameters.

In some embodiment, the injection molding method further includes the operations of: simulating, by the optimized digital twin model, the plurality of physical parameters to generate the plurality of simulated parameters according to a plurality of second input parameters; and determining whether the plurality of simulated parameters satisfy a predetermined requirement of the injection molding product.

In some embodiment, the injection molding method further includes modifying the plurality of second input parameters when the plurality of simulated parameters do not satisfy the predetermined requirement.

In some embodiment, when the plurality of simulated parameters are determined that satisfies the predetermined requirement, the operation of producing the injection molding product is performed.

In some embodiment, the operation of validating whether the digital twin model being the optimized digital twin model according to the plurality of simulated parameters and the plurality of physical parameters includes comparing the plurality of simulated parameters to the plurality of physical parameters. The operation of analyzing the plurality of physical parameters to generate the optimized digital twin model of the physical asset further includes determining the digital twin model being the optimized digital twin model when the plurality of simulated parameters coincide with the plurality of physical parameters.

In some embodiment, a virtual asset described by the optimized digital twin model is identical to the physical asset.

Another aspect of the present disclosure provides an injection molding system including a physical asset and a control module. The physical asset is configured to perform an injection molding process to produce an injection molding product according to a plurality of input parameters. The control module includes a sensing device and a process device. The sensing device is configured to sense a plurality of physical parameters associated with the injection molding product. The process device is configured to simulate, by using a digital twin model, the plurality of physical parameters to generate a plurality of simulated parameters according to the plurality of input parameters, and configured to optimize the digital twin model when the plurality of physical parameters differ from the plurality of simulated parameters to generate an optimized digital twin model.

In some embodiments, the process device is further configured to validate whether the digital twin model is the optimized digital twin model according to the plurality of simulated parameters and the plurality of physical parameters.

In some embodiments, the process device compares the plurality of simulated parameters to the plurality of physical parameters so as to validate whether the digital twin model is the optimized digital twin model.

In some embodiments, when the plurality of simulated parameters coincide with the plurality of physical parameters, the process device determines that the digital twin model is the optimized digital twin model.

In some embodiments, the injection molding system further includes a user interface configured to transmit the input parameters to the physical asset and the control model, wherein the user interface is further configured to modify the input parameters.

In some embodiments, the process device is further configured to simulate, by using the optimized digital twin model, the plurality of physical parameters to generate the plurality of simulated parameters according to the plurality of input parameters after the plurality of input parameters being modified.

In some embodiments, the control module is further configured predict the physical parameters associated with the injection molding product according to the optimized digital twin model.

In some embodiments, the physical asset is further configured to generate a plurality of intermediated parameters associated a material, a part, a molding tool, and process conditions of the injection molding process before producing the injection molding product.

In some embodiments, the process device is further configured to simulate, by using the digital twin model, the intermediated parameters according to the input parameters.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 6 is a detailed flow chart of an injection molding method according to some embodiments of the present disclosure

DETAILED DESCRIPTION

Figure 1:
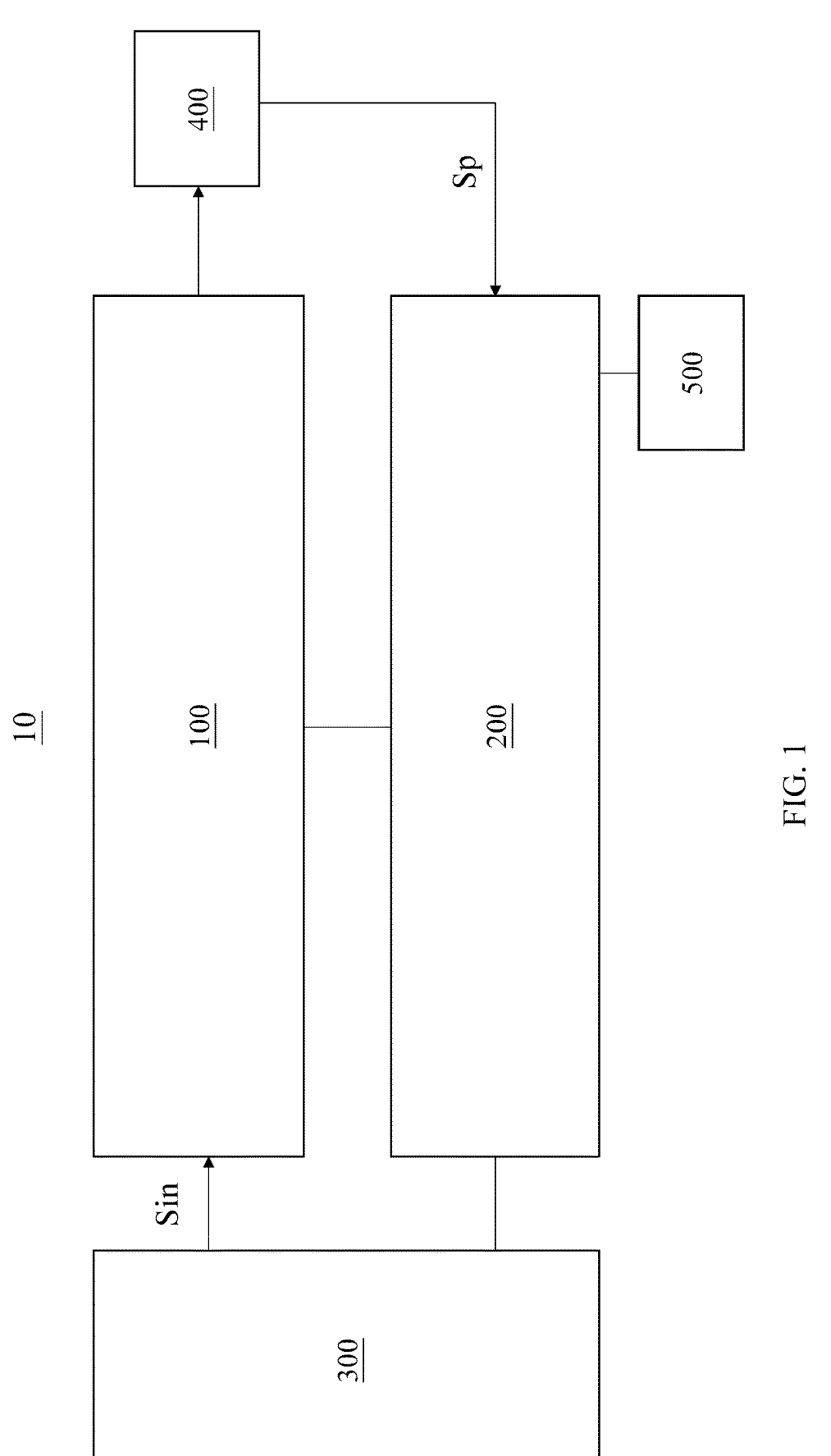
FIG. 1 is a schematic diagram of an injection molding system according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is an injection molding system 10 according to some embodiments of the present disclosure. The injection molding system 10 includes a physical asset 100 and a control module 200. The injection molding system 10 is configured to produce an injection molding product 400 according to input parameters Sin. The input parameters Sin is provided by a user interface 300. In some embodiments, the input parameters Sin is determined by a technician and provided to the physical asset 100 through the user interface 300. In other embodiments, the input parameters Sin is predetermined and stored in a memory unit of the user interface 300. In some embodiments, the user interface 300 is further configured to transmit the input parameters Sin to the control module 200.

The physical asset 100 is configured to perform an injection molding process to produce the injection molding product 400 according to the input parameters Sin. The input parameters Sin are associated with process conditions, dynamic behaviors, physical properties, counterpart attributes, and design data. In some embodiments, the input parameters Sin includes the pressure, the temperature, the density of the molding, the dimension of the physical asset 100, the flow speed of the molding in the physical asset 100, the bump density of the injection molding product 400, the material of the bumps, the viscosity of the molding, or the combination thereof.

The control module 200 is configured to measure physical parameters Sp of the injection molding product 400. The physical parameters Sp are associated with the performance of the injection molding process. The outcome of the injection molding product 400 can be retrieved from the physical parameters Sp. In some embodiments, the physical parameters Sp includes the porosity of the molding of the injection molding product and the viscosity profile of the molding during the injection molding process.

The above-mentioned parameters are provided for illustrative purposes. Various suitable input parameters Sin and physical parameters Sp are within the contemplated scope of the present disclosure.

The control module 200 is further configured to simulate the physical parameters Sp by using a digital twin model DTM which describes the physical asset 100. More specifically, the control module 200 generates simulated parameters Sm by simulating the physical parameters Sp. The control module 200 executes a computer-aided engineering (CAE) simulation software to conduct the simulation. The simulation is conducted based on the digital twin model DTM, and the simulated parameters Sm correspond to the physical parameters Sp.

The digital twin model DTM corresponds to the physical asset 100. Alternatively stated, the digital twin model DTM is a virtual asset similar to the physical asset 100. Therefore, when the control module 200 performs the simulation, the simulated parameters Sm generated by the control module 200 are similar to the physical parameters Sp.

In some embodiments, the injection molding system 10 further includes a memory device 500 configured to store the digital twin model DTM. When the simulation is conducted, the control module 200 accesses the memory device 500 to obtain the digital twin model DTM. In some embodiments, the generated physical parameters Sp are stored in the memory device 500. In other embodiments, the memory device 500 is an internal device of the control module 200.

Figure 2:
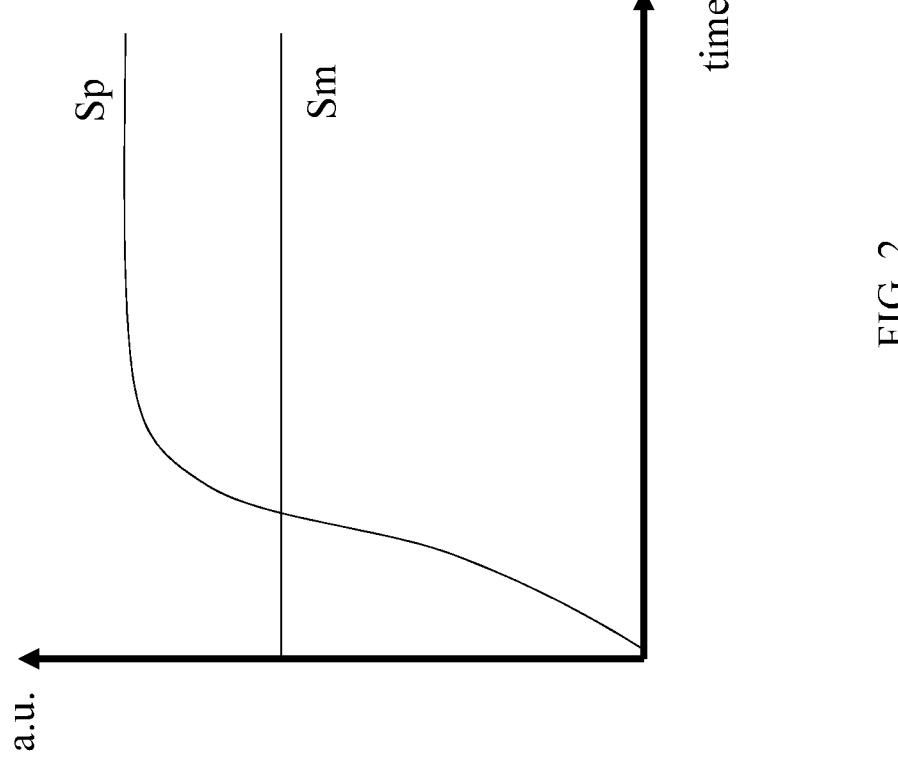
FIG. 2 is a schematic diagram of physical parameters and simulated parameters varying with time according to some embodiments of the present disclosure.

In some embodiments, the simulated parameters Sm is similar to but not exactly the same as the physical parameters Sp. In other words, the virtual asset described by the digital twin model DTM is not exactly the same as the physical asset 100. In other embodiments, the physical parameters Sp vary along time. However, when the digital twin model DTM haven't been optimized to coincide with the physical asset 100, the physical parameters Sp might differ from the simulated parameters Sm as illustrated in FIG. 2.

Under this condition, the control module 200 is further configured to optimize the digital twin model DTM to generate an optimized digital twin model OM. The control module 200 conducts the simulation based on the optimized digital twin model OM so as to generate the simulated parameters Sm more close to the physical parameters Sp. Therefore, before the injection molding process is performed, the control module 200 can predict the outcome of the injection molding product 400 by using the optimized digital twin model OM to simulate the physical parameters Sp. Because the prediction (i.e., the simulation based on the optimized digital twin model OM) is accurate, the injection molding product 400 can be produced precisely without wasting unnecessary process cost.

The virtual asset described by the optimized digital twin model OM is expected to be identical to the physical asset 100. In some embodiments, the operation of optimizing is performed more than one iteration to obtain the optimized digital twin model OM.

Alternatively stated, the control module 200 is configured to train the digital twin mode DTM by using the physical parameters Sp. In various embodiments, in order to collect different physical parameters Sp under different situations, the input parameters Sin are randomly generated by a pseudo-random generator so as to provide various physical parameters Sp to the control module 200. The injection molding system 10 is thus able to self-train the digital twin model DTM to generate the optimized digital twin model OM.

In some embodiments, the physical asset 100 in the injection molding system 10 is replicable. For example, when the physical asset 100 is replaced by another injection machinery, the virtual asset described by the original digital twin model DTM is different form said injection machinery. Consequently, the simulated parameters Sm are different from the physical parameters Sp based on the said injection machinery and the original digital twin model DTM. The digital twin model DTM need to be optimized to coincide with the said injection machinery. Therefore, the injection molding system 10 can predict accurate physical parameters Sp no matter the physical asset 100 being replaced by whichever machinery.

Moreover, when the input parameters Sin vary, the control module 200 is still able to, using the optimized digital twin model OM, predict the outcome (i.e., the physical parameters Sp) of the injection molding product 400 based on the varied input parameters Sin. Particularly, the physical asset 100 does not have to produce the injection molding product 400, and the precise physical parameters Sp of the injection molding product 400 can be obtained.

Figure 3:
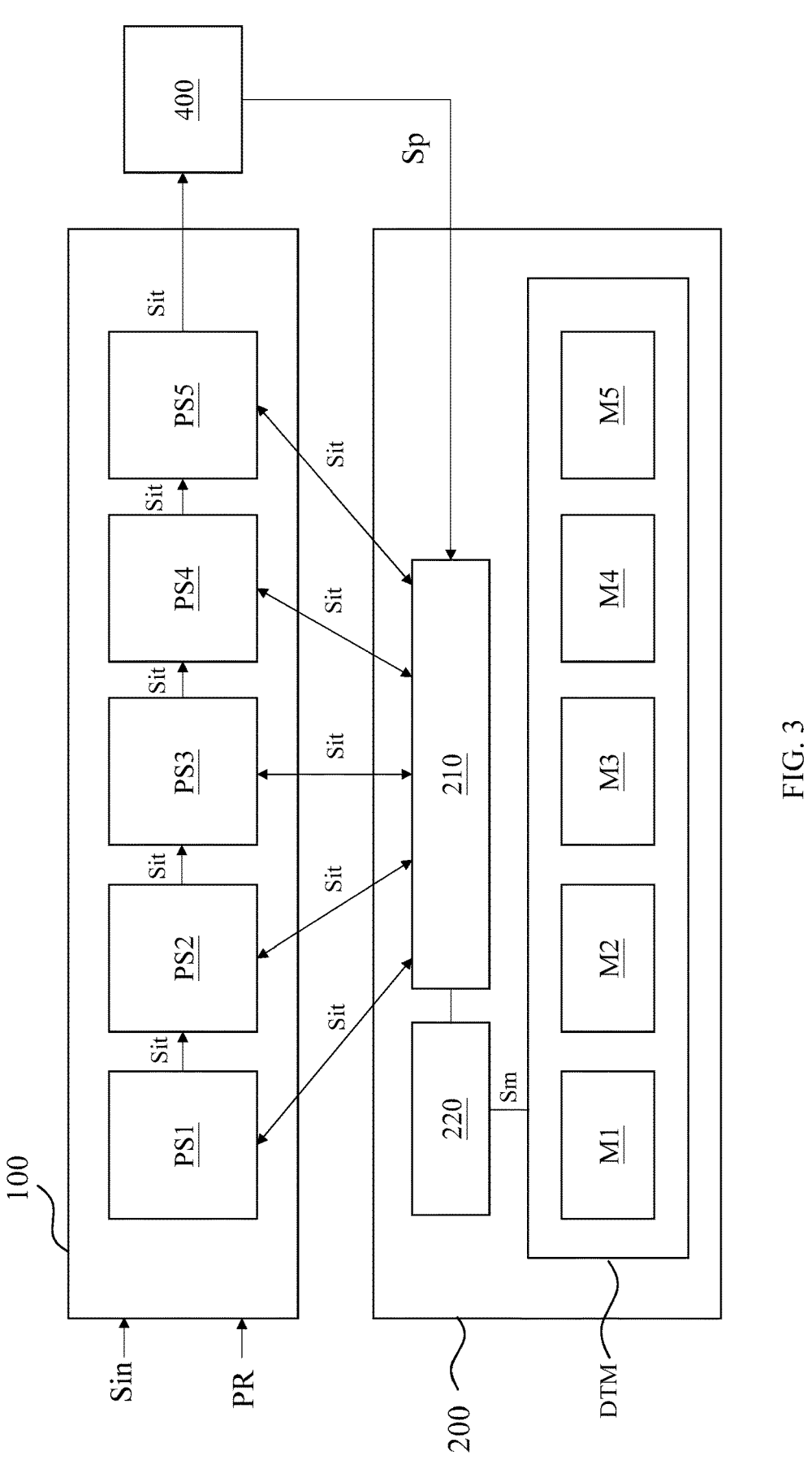
FIG. 3 is a schematic diagram of an injection molding system according to some embodiments of the present disclosure.

Reference is made to FIG. 3. FIG. 3 is a schematic diagram of injection molding system 10 according to some embodiments of the present disclosure.

As shown in FIG. 3, the control module 200 includes a sensing device 210 and a process device 220. The sensing device 210 is coupled to the physical asset 100 and the product 400. The process device 220 is coupled to the sensing device 210 and the memory device 500.

In some embodiments, the injection molding process performed by the physical asset 100 includes steps of: a material design phase PS1, a part design phase PS2, a mold design phase PS3, a mold tooling phase PS4, and a process condition phase PS5. In other words, before producing the injection molding product 400, the material, the part, the mold, the molding tool, and process conditions are determined and/or designed according to a predetermined requirement PR of the injection molding product 400. The physical asset 100 receives the input parameters Sin and the predetermined requirement PR to generate intermediated parameters Pit associated with the material, the part, the mold, the molding tool, and the process conditions, and the injection molding process is performed based on the intermediated parameters Pit to produce the injection molding product 400. In some embodiments, those phases PS1-PS5 are performed sequentially as shown in FIG. 3. However, the present disclosure is not intended to be limiting. In other embodiments, the injection molding process performed by the physical asset 100 further includes phases other than the phases PS1-PS5. In various embodiments, those phases PS1-PS5 are not sequentially performed as shown in FIG. 3. Alternatively stated, the phases PS1-PS5 have no sequential relation between each other.

In some embodiments, the digital twin model DTM has digital twin sub-models M1-M5 corresponding to the material design phase PS1, the part design phase PS2, the mold design phase PS3, the mold tooling phase PS4, and the process condition phase PS5, respectively. The sensing device 210 is configured to sense the intermediated parameters Pit in those phases PS1-PS5, and sense the physical parameters Sp of the injection molding product 400. Similarly, in other embodiments, the digital twin model DTM further has digital twin sub-models other than the digital twin sub-models M1-M5 when the injection molding process includes phases other than the phases PS1-PS5.

The process device 220 is configured to perform CAE simulation by using the digital twin sub-models M1-M5 to simulate the result of phases PS1-PS5. The simulation using digital twin sub-models M1-M5 is similar to the simulation using digital twin model DTM of the embodiments with respect to FIG. 1. Therefore, the process device 220 is configured to optimized each digital twin sub-models M1-M5 as well.

After the digital twin sub-model M1-M5 are optimized, the control module 200 is configured to determine whether simulated parameters Sm associated with the input parameters Sin are satisfy with the predetermined requirement PR. When the predetermined requirement is not achieved, the input parameters Sin are modified, and the control module 200 simulates the physical parameters Sp according to the modified input parameters Sin. Until the simulated parameters Sm satisfy the predetermined requirement PR, the physical asset 100 produces the injection molding product 400 according to the modified input parameters Sin.

The control module 200 shown in FIG. 3 is provided for illustrative purposes. Various control modules 200 are within the contemplated scope of the present disclosure. In various embodiments, the process device 220 does not perform CAE simulation by using all of the digital twin sub-models M1-M5. For example, the process device 220 performs CAE simulation by using three (e.g., M1, M3, and M4) of the digital twin sub-models M1-M5 to simulate the result of three (e.g., the corresponded PS1, PS3, and PS4) of the phases PS1-PS5. In alternative embodiments, the process device 220 performs CAE simulation by merely using one phase of the phases PS1-PS5. It will be appreciated that the number of the phases performed by the process device 220 is not limited by the above embodiments.

Figure 4:
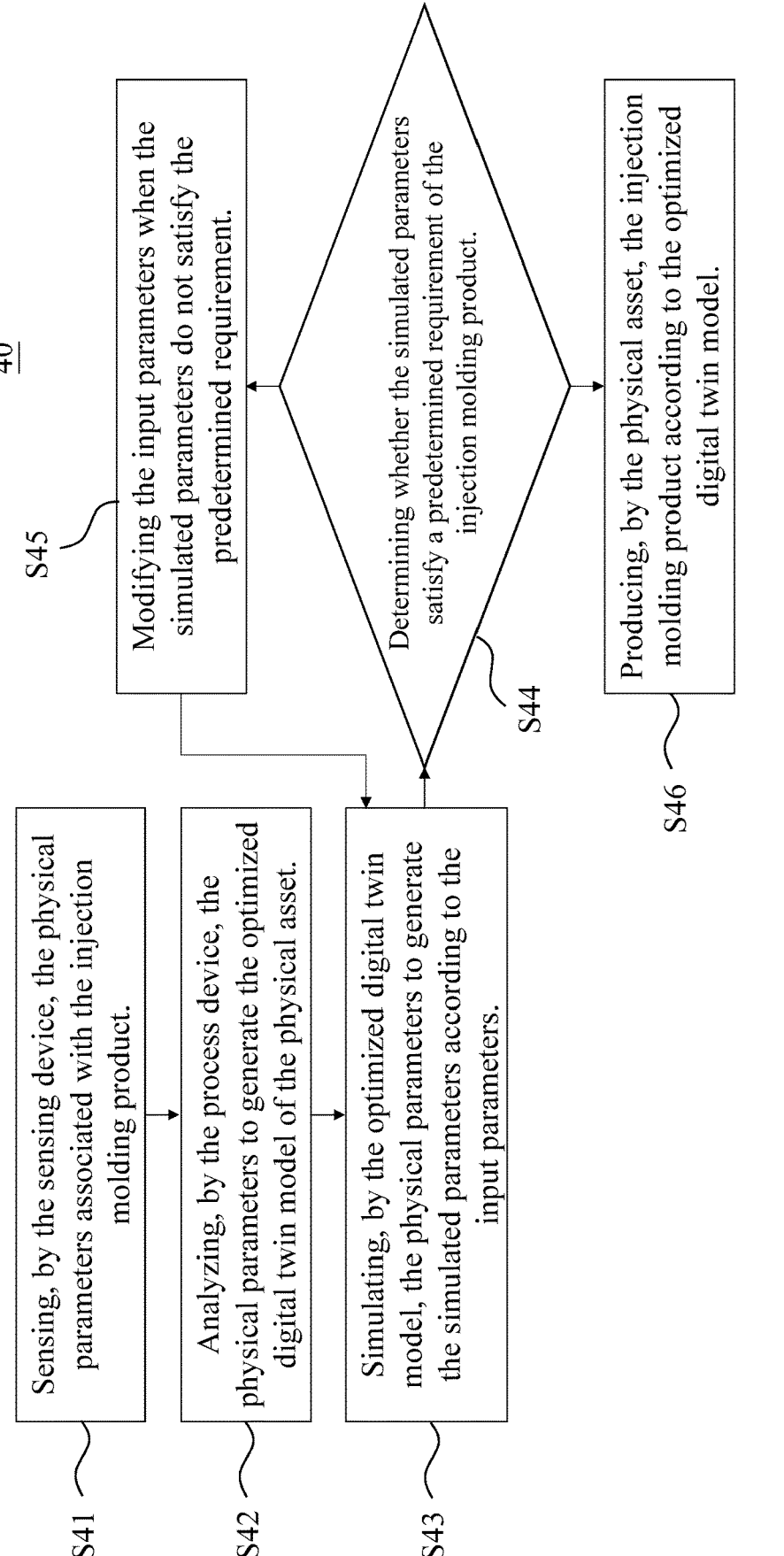
FIG. 4 is flow chart of an injection molding method according to some embodiments of the present disclosure.

Reference is made to FIG. 4. FIG. 4 is a flow chat of an injection molding method 40 according to some embodiments of the present disclosure. In some embodiments, the injection molding method 40 is performed by the injection molding system 10. The injection molding method 40 includes operations S41, S42, S43, S44, S45, and S46. To facilitate understanding, the injection molding method 40 is described with reference numerals as shown in FIG. 1 to FIG. 3.

In operation S41, the sensing device 210 senses the physical parameters SP associated with the injection molding product 400. In some embodiments, the sensing device 210 senses the intermediated parameters Sit before the injection molding product 400 is produced.

Figure 5:
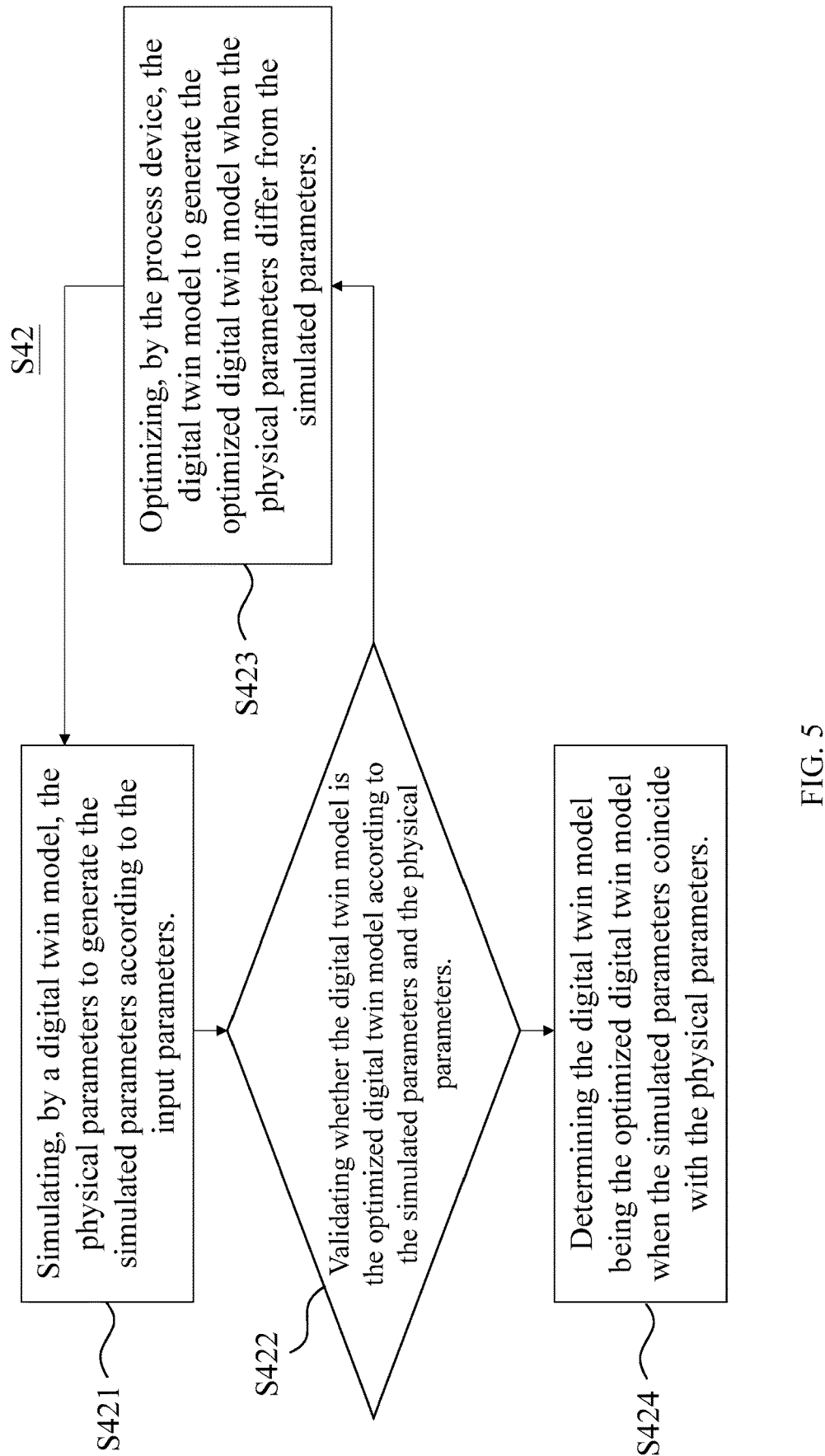
FIG. 5 is a detailed flow chart of an injection molding method according to some embodiments of the present disclosure.

In operation S42, the process device 220 analyzes the physical parameters Sp to generate the optimized digital twin model OM of the physical asset 100. In some embodiments, the process device 220 analyzes the intermediated parameters Sit before analyzing the physical parameters Sp. Please refer to FIG. 5, the operation S42 includes operations S421, S422, S423, and S424.

In operation S421, the process device 220 simulates, by using the digital model DTM, the physical parameters Sp to generate the simulated parameters Sm according to the input parameters Sin. In some embodiments, the physical asset 100 generates the intermediated parameters Sit associated with the material design phase PS1, the part design phase PS2, the mold design phase PS3, the mold tooling phase PS4, and the process condition phase PS5 according to the input parameters Sin. The process device 220 simulates the intermediated parameters Sit associated with those phases PS1-PS5 by using digital twin sub-models M1-M5 of the digital twin model DTM, respectively.

Figure 6:
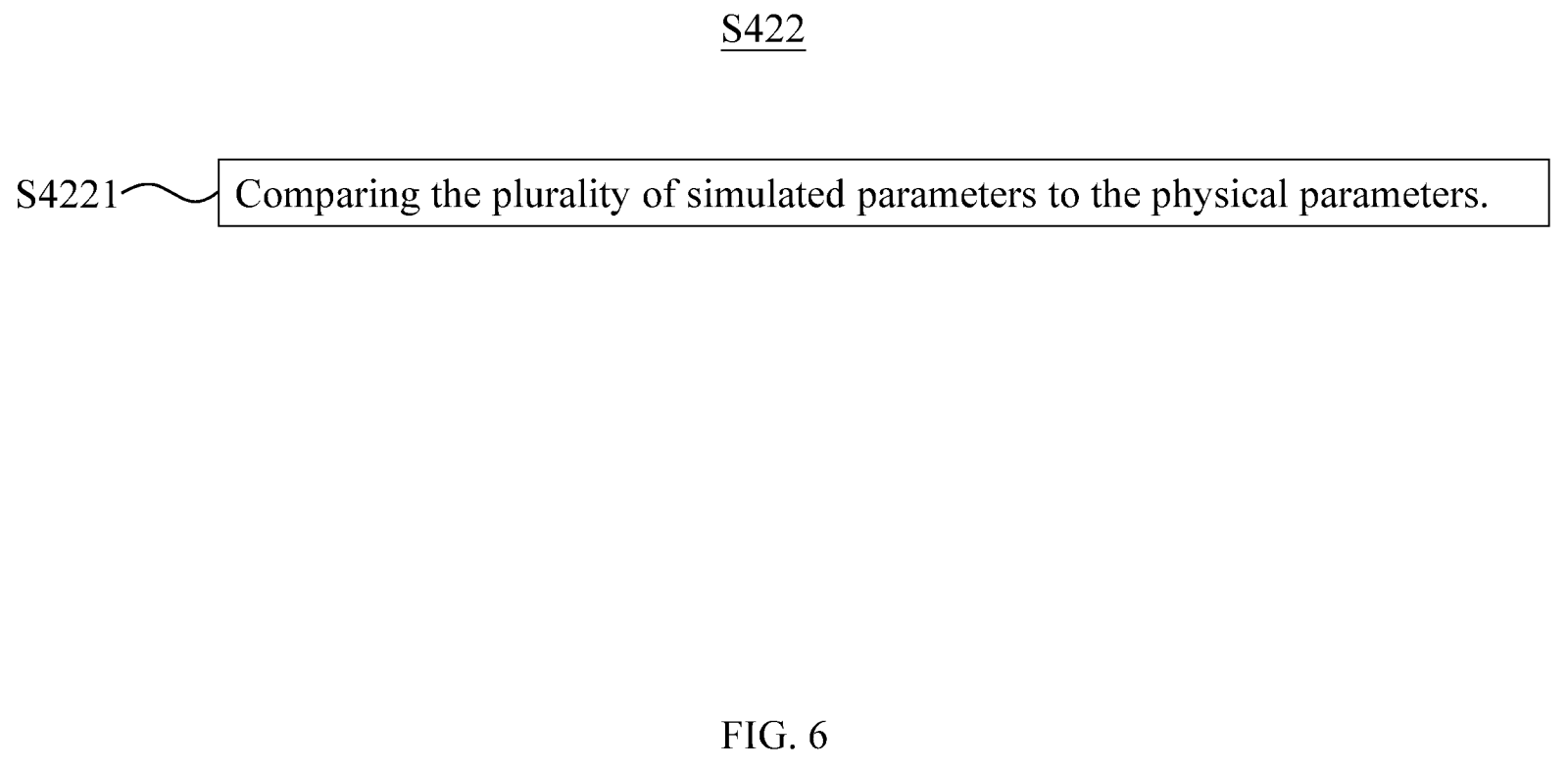

In operation S422, the process device 220 validates whether the digital twin model DTM is the optimized digital twin model OM according to the simulated parameters Sm and the physical parameters Sp. Specifically, the operation S422 includes an operation S4221 as illustrated in FIG. 6. In operation S4221, the process device 220 compares the simulated parameters Sm to the physical parameters Sp.

When the simulated parameters Sm differ from the physical parameters Sp, the injection molding method 40 proceeds to the operation S423. On the other hand, when the simulated parameters Sm coincide with the physical parameters Sp, the injection method 40 proceeds to the operation S424.

In operation S423, the process device 220 optimizes the digital twin model DTM to generate the optimized digital twin model OM when the physical parameters differ from the simulated parameters Sm. After the operation S423, the injection molding method 40 proceeds to the operation S421 to simulate the physical parameters Sp again by using the digital twin model DTM optimized in the operation S423. The injection molding method 40 leaves the operational loop of operations S421-S423 to the operation S424 until the simulated parameters Sm coincide with the physical parameters Sp.

In operation S424, the digital twin model DTM is determined to be the optimized digital twin model OM when the simulated parameters Sm coincide with the physical parameters Sp.

Please refer to FIG. 4. In operation S43, the process device 220 simulates, by using the optimized digital twin model OM, the physical parameters Sp according to the input parameters Sin. In some embodiments, the input parameters Sin used in operation S43 are different from the input parameters Sin used in the operation S42.

In operation S44, the simulated parameters Sm generated in the operation S43 are determined whether satisfy the predetermined requirement PR of the injection molding product 400. When the simulated parameters Sm satisfy the predetermined requirement PR, the injection molding method 40 proceeds to the operation S46. When the simulated parameters Sm do to satisfy the predetermined requirement PR, the injection molding method 40 proceeds to the operation S45.

In operation S45, the input parameters Sin are modified when the simulated parameters Sm do not satisfy the predetermined requirement PR. After the operation S45 is performed, the injection molding method 40 proceeds to the operation S43. The injection molding method 40 leaves the operational loop of operations S43-S45 until the simulated parameters Sm satisfy the predetermined requirement RP.

In operation S46, the physical asset 100 produces the injection molding product 400 according to the input parameters Sin which is modified according to the optimized digital twin model OM.

One aspect of the present disclosure provides an injection molding method including the operations of: sensing, by a sensing device, a plurality of physical parameters associated with an injection molding product; analyzing, by a process device, the plurality of physical parameters to generate an optimized digital twin model of a physical asset; producing, by the physical asset, the injection molding product according to the optimized digital twin model. The operation of analyzing the plurality of physical parameters to generate the optimized digital twin model of the physical asset includes the operations of: simulating, by a digital twin model, the plurality of physical parameters to generate a plurality of simulated parameters according to a plurality of first input parameters; validating whether the digital twin model is an optimized digital twin model according to the plurality of simulated parameters and the plurality of physical parameters; and optimizing, by the process device, the digital twin model to generate the optimized digital twin model when the plurality of physical parameters differ from the plurality of simulated parameters.

Another aspect of the present disclosure provides an injection molding system including a physical asset and a control module. The physical asset is configured to perform an injection molding process to produce an injection molding product according to a plurality of input parameters. The control module includes a sensing device and a process device. The sensing device is configured to sense a plurality of physical parameters associated with the injection molding product. The process device is configured to simulate, by using a digital twin model, the plurality of physical parameters to generate a plurality of simulated parameters according to the plurality of input parameters, and configured to optimize the digital twin model when the plurality of physical parameters differ from the plurality of simulated parameters to generate an optimized digital twin model.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. An injection molding method, comprising:
determining, by a physical asset, a plurality of intermediated parameters according to a predetermined requirement of an injection molding product, wherein the plurality of intermediated parameters are associated with a material, a part, a mold, and a plurality of process conditions of the injection molding produce;
sensing, by a sensing device, the plurality of intermediated parameters and a plurality of physical parameters associated with the injection molding product;
analyzing, by a process device, the plurality of physical parameters to generate an optimized digital twin model of the physical asset, wherein the operation of analyzing the plurality of physical parameters to generate the optimized digital twin model of the physical asset comprises:
simulating, by a plurality of sub-models of a digital twin model, the plurality of intermediated parameters to generate a plurality of simulated intermediated parameters, respectively, and simulating the plurality of physical parameters to generate a plurality of simulated parameters according to a plurality of first input parameters, wherein the plurality of sub-models corresponding to the material, the part, the mold, and the plurality of process conditions of the injection molding product;
validating whether the digital twin model is the optimized digital twin model according to the plurality of simulated intermediated parameters, the plurality of simulated parameters and the plurality of physical parameters; and
optimizing, by the process device, the digital twin model to generate the optimized digital twin model when the plurality of physical parameters differ from the plurality of simulated parameters; and
producing, by the physical asset, the injection molding product according to the optimized digital twin model.

2. The injection molding method of claim 1, further comprising:

simulating, by the optimized digital twin model, the plurality of physical parameters to generate the plurality of simulated parameters according to a plurality of second input parameters; and
determining whether the plurality of simulated parameters satisfy the predetermined requirement of the injection molding product.

3. The injection molding method of claim 2, further comprising:
modifying the plurality of second input parameters when the plurality of simulated parameters do not satisfy the predetermined requirement.

4. The injection molding method of claim 2, wherein when the plurality of simulated parameters are determined that satisfies the predetermined requirement, the operation of producing the injection molding product is performed.

5. The injection molding method of claim 1, wherein the operation of validating whether the digital twin model being the optimized digital twin model according to the plurality of simulated intermediated parameters, the plurality of simulated parameters and the plurality of physical parameters comprises:
comparing the plurality of simulated parameters to the plurality of physical parameters,
wherein the operation of analyzing the plurality of physical parameters to generate the optimized digital twin model of the physical asset further comprises:
determining the digital twin model being the optimized digital twin model when the plurality of simulated parameters coincide with the plurality of physical parameters.

6. The injection molding method of claim 1, wherein a virtual asset described by the optimized digital twin model is identical to the physical asset.

7. An injection molding system, comprising:
a physical asset, configured to determine a plurality of intermediated parameters according to a predetermined requirement of an injection molding product and perform an injection molding process to produce the injection molding product according to a plurality of input parameters, wherein the plurality of intermediated parameters are associated with a material, a part, a mold, and a plurality of process conditions of the injection molding product; and
a control module, comprising:
a sensing device, configured to sense the plurality of intermediated parameters and a plurality of physical parameters associated with the injection molding product; and
a process device, configured to:
simulate, by using a plurality of sub-models of a digital twin model, the plurality of intermediated parameters to generate a plurality of simulated intermediated parameters respectively, wherein the plurality of sub-models corresponding to the material, the part, the mold, the molding, and the plurality of process conditions of the injection molding product,
simulate, by the digital twin model, the plurality of physical parameters to generate a plurality of simulated parameters according to the plurality of input parameters, and
optimize the digital twin model when the plurality of physical parameters differ from the plurality of simulated parameters to generate an optimized digital twin model,
wherein after the optimized digital twin model is generated, the physical asset produces the injection molding according to the optimized digital twin model and the plurality of intermediated parameters.

8. The injection molding system of claim 7, wherein the process device is further configured to validate whether the digital twin model is the optimized digital twin model according to the plurality of simulated parameters and the plurality of physical parameters.

9. The injection molding system of claim 8, wherein the process device compares the plurality of simulated parameters to the plurality of physical parameters so as to validate whether the digital twin model is the optimized digital twin model.

10. The injection molding system of claim 9, wherein when the plurality of simulated parameters coincide with the plurality of physical parameters, the process device determines that the digital twin model is the optimized digital twin model.

11. The injection molding system of claim 7, further comprising:

a user interface, configured to transmit the input parameters to the physical asset and the control module, wherein the user interface is further configured to modify the input parameters.

12. The injection molding system of claim 11, wherein the process device is further configured to simulate, by using the optimized digital twin model, the plurality of physical parameters to generate the plurality of simulated parameters according to the plurality of input parameters after the plurality of input parameters being modified.

13. The injection molding system of claim 7, wherein the control module is further configured predict the physical parameters associated with the injection molding product according to the optimized digital twin model.

14. The injection molding system of claim 7, wherein the plurality of intermediated parameters are further associated with a molding tool of the injection molding process before producing the injection molding product.

15. The injection molding system of claim 14, wherein the intermediated parameters are simulated according to the input parameters.

\* \* \* \* \*